Jan. 11, 1966 B. L. RICE ETAL 3,228,091

METHOD OF MAKING PRINTED CIRCUIT BOARD

Filed Dec. 30, 1960 2 Sheets-Sheet 1

INVENTOR.
BERNARD L. RICE
FREDERICK W. WINGER
BY
Robert C. Smith
ATTORNEY

METHOD OF MAKING PRINTED CIRCUIT BOARD

Filed Dec. 30, 1960 2 Sheets-Sheet 2

INVENTOR.
BERNARD L. RICE
FREDERICK W. WINGER
BY

ATTORNEY 3,228,091

METHOD OF MAKING PRINTED CIRCUIT BOARD

Bernard L. Rice and Frederick W. Winger, Mishawaka, Ind., assignors to The Bendix Corporation, Mishawaka, Ind., a corporation of Delaware Filed Dec. 30, 1960, Ser. No. 79,803
7 Claims. (Cl. 29—155.5)

This invention relates to electrical sub-assemblies, and more particularly, to a highly reliable sub-assembly permitting particularly high densities of wiring, components and solder joints and the method of making such sub-assemblies.

In many current applications, particularly in the missile field, there is a need for better means for increasing the density of electrical circuitry which can be physically located in a given volume. The densities required for present day circuitry have made it very difficult, in many cases, to use printed circuits wherein the circuit is printed on only one side. Consequently, considerable work and effort have been expended in attempting to manufacture reliable printed circuit boards having circuitry printed on both sides of the board with connections extending through the board from one side to the other. It has been found that where the boards used were comparatively thin, of the order of $\frac{1}{16}$ inch, standard production techniques would provide reliable interface connections for such boards for many applications. However, in the missile field it is often necessary that the boards be considerably thicker than $\frac{1}{16}$ inch and may be of the order of $\frac{1}{8}$ inch or $\frac{3}{16}$ of an inch to meet the necessary mechanical requirements of resistance to shock, vibration, etc. In attempting to produce sub-assemblies utilizing these boards, it has been found that the boards, as supplied by the board manufacturers have had reasonably good interface connections. However, as soon as it was attempted to assemble components to the boards, it appeared that many of the interface connections had failed, presumably as a result of thermal differences between the electro-deposited copper material in the interiors of the holes and the board itself. In case after case it was determined that the location at which the failure occurred was the shoulder between the cylindrical interface connection and the strap on the surface of the board. In attempting to solve this problem the applicants found it necessary to increase the diameter of the passage between the faces of the board to approximately $\frac{2}{3}$ of the board thickness or greater. While reasonably reliable interface connections could be made by dip soldering with such large holes, the solder joints themselves became rather large and significantly heavy and effectively reduced the density of such joints which could be accommodated on a given area. Considerable experimentation with present day interface eyelets has failed to disclose any which were capable of producing interface connections with the reliability required for missile applications. It has also been found that a considerable advantage is gained if all solder connections permit inspection from one side of the board, since the opposite side may be attached against a wall or bulkhead. This also permits some repairs without requiring removal or discarding of the entire sub-assembly. From the foregoing it appeared that a new design concept was needed to provide the advantage of both two sided and single sided circuitry and to obtain assembly miniaturization without the disadvantages of plated through holes or eyelets. Applicants have therefore devised a printed circuit board and board assembly and method of manufacturing said board and assembly in which the board is composed of layers of circuitry in which the circuits are accessible from one face through perforations in the outer layers of insulation material to expose the solder points on the underlying layers. A number of significant problems became apparent during the course of attempting to produce such circuit boards. Accomplishing a satisfactory bond between the layers proved to be no insignificant problem and further, it was observed that in many cases the surface of the printed circuit boards had deteriorated as to finish during the course of the bonding operation. It was also necessary to provide means for assuring a substantially perfect registry between the printed circuit layers. It is therefore an object of the present invention to provide a multiple layer printed circuit assembly in which all solder connections are accessible from one side of the assembly.

It is another object of the present invention to provide a multiple layer printed circuit assembly in which the electrical connections between the layers are reliable to the extent required for missile applications.

It is another object of the present invention to provide a method for manufacturing the above described laminated printed circuit boards and assemblies.

It is a further object of the present invention to provide a printed circuit board assembly which accomplishes the above objects and which meets the requirements of missile applications as to mechanical shock and vibration requirements.

Other objects and advantages will become apparent from the following specification in which.

Figure 1:
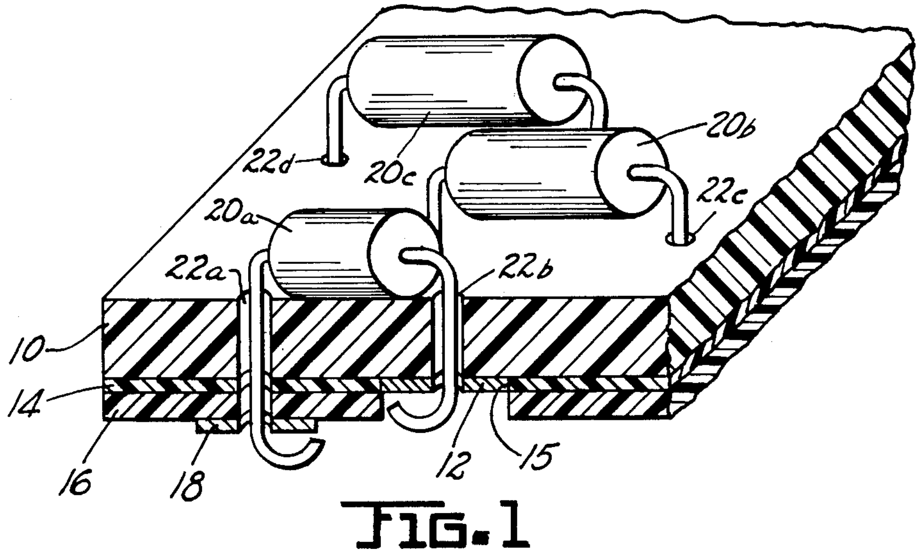
FIGURE 1 is a fragmentary sectional view of a laminated printed circuit board assembly utilizing our construction.

A sectional view of a typical two-layer laminated printed circuit board assembly is shown in FIGURE 1. A base layer 10 is provided having a sufficient thickness to constitute the major load bearing member of the structure having printed circuitry 12 bonded thereto. An adhesive layer 14 is bonded to base layer 10 and also to an outer layer 16. It will be noted that the adhesive layer is cut out at 15 to expose the solder terminal on the printed circuitry 12. An additional layer of printed circuitry 18 is shown bonded to outer layer 16. A number of tubular resistors 20*a*, 20*b*, 20*c* have their respective wire leads extending through a series of holes 22*a*, 22*b*, 22*c*, etc., and it will be observed that the leads from resistor 20*a* are fed through holes 22*a* and 22*b* and are "pigtailed" against the printed circuit sections 12 and 18. With the assembly as shown, it is in condition to be subjected to a dip solder operation and only the bottom side need be exposed to the solder bath inasmuch as there are no solder connections accessible from the top side.

Figure 2:
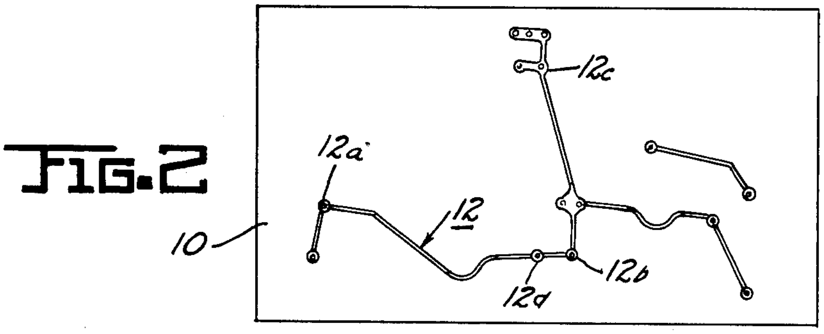
FIGURE 2 is a plan view of a typical base layer of printed circuit board such as might be used in our invention.

In FIGURES 2, 3, 4 and 5 applicants have attempted to show the device of FIGURE 1 with its component parts disassembled in layers. FIGURE 2 shows the base layer 10 in plan view. It will be noted that it carries a pattern of printed circuitry 12 including a number of solder terminals 12*a*, 12*b*, 12*c*, etc. This base layer 10, in the particular application with which applicants have been working, has been made of epoxy glass laminate, but it could as well be made of other materials such as a phenolic laminate.

Figure 3:
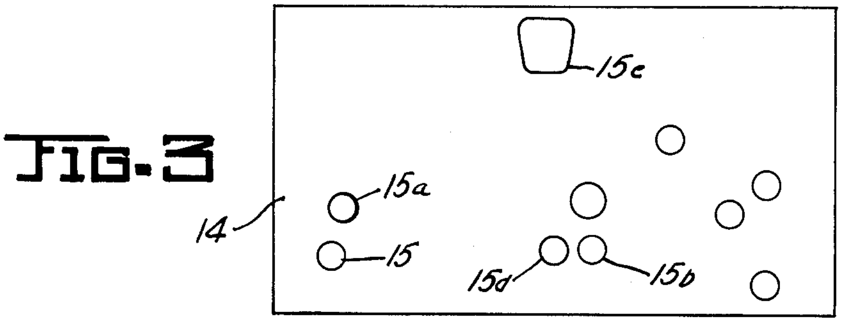
FIGURE 3 is a plan view of a typical adhesive layer suitable for use with the base layer of FIGURE 2.

FIGURE 3 shows an adhesive layer which would be applied directly over the circuit board 10 of FIGURE 2. This adhesive layer 14 contains a number of holes or perforations, 15*a*, 15*b*, which register with the solder terminals 12*a*, 12*b*, 12*c* etc., which appear on the base layer 10. This adhesive layer would normally vary in its material depending upon the material of the printed circuit layers with which it was required to bond. Where the printed circuit layers are epoxy glass laminate, as described, the adhesive layer which has been found to be most satisfactory is composed of glass cloth impregnated with an epoxy resin and cured to the "B" stage. As understood in the art, curing an epoxy resin to the "B" stage refers to a partial curing so that the resin can be softened under heat sufficient to flow and form a bond with an adjoining surface before it is ultimately completely cured. A glass cloth impregnated with a "B" stage epoxy resin is, therefore, comparatively easy to handle and to cut to the desired dimensions because it is not actually sticky at room temperatures.

Figure 4:
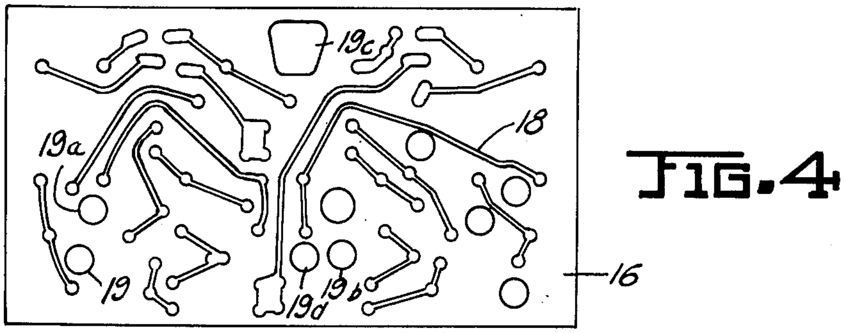
FIGURE 4 shows a plan view of a typical outer layer of printed circuitry suitable for use in combination with the base layer 2 and the adhesive layer 3.

FIGURE 4 shows a typical outer layer of printed circuitry which in the present instance is constituted of epoxy glass laminate. This outer layer contains a rather detailed pattern of printed circuitry 18 including a plurality of solder terminals and also a plurality of perforations 19*a*, 19*b*, 19*c*, etc., which register exactly with the perforations 15, 15*a*, 15*b*, etc. of the adhesive layer 14. It will be observed that the pattern of circuitry in FIGURE 4 is considerably more elaborate than that of FIGURE 2 and it will be recognized that there is considerable advantage in minimizing the amount of circuitry and the number of terminals in the lower layers in order to minimize the number of perforations in the outer layer or layers.

Figure 5:
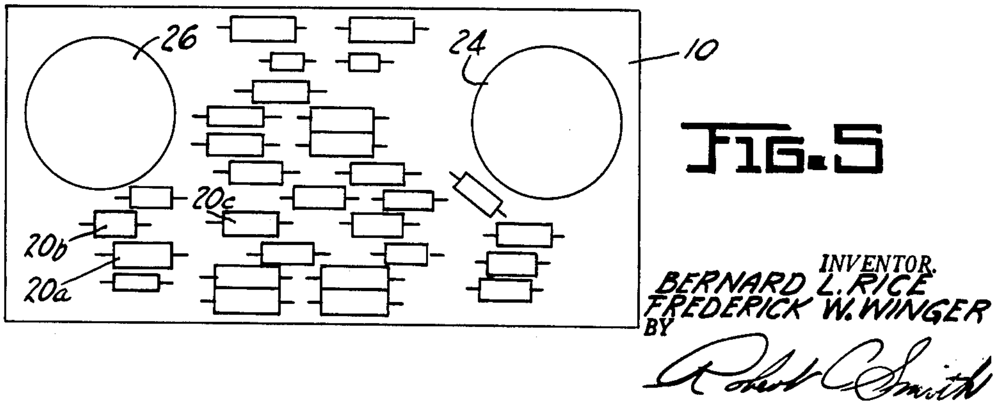
FIGURE 5 shows a typical pattern in which electrical components might be attached to the back of FIGURE 2.

FIGURE 5 shows a typical pattern of the manner in which components such as potentiometers 24 or 26 or resistors 20*a*, 20*b*, or 20*c*, etc. might be fastened to the back side of base layer 10. If the layers 10, 14 and 16 are superimposed, one on top of the other, it will be observed that the perforations 15, 15*a*, etc., and 19, 19*a*, etc. are in registry directly above the solder terminals 12*a*, 12*b*, etc. shown on the base laminate layer 10. The leads from the resistors 20*a*, 20*b*, etc., will engage a large number of small holes 22*a*, 22*b* (see FIGURE 1) extending through the entire assembly and will make contact with the solder terminals of either layer 10 or layer 16.

Figure 6:
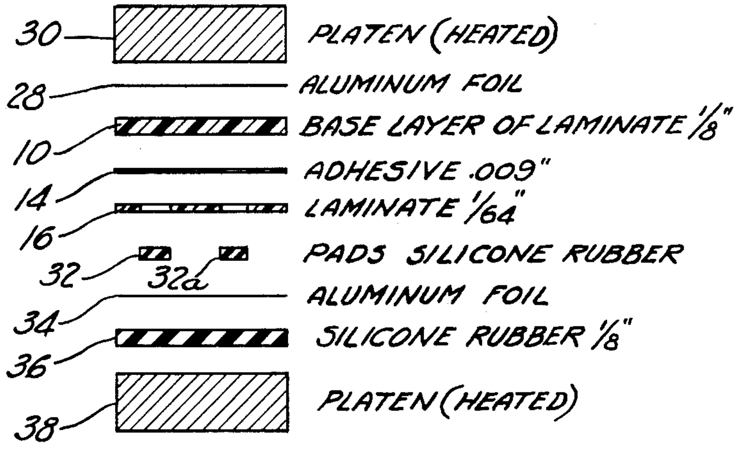
FIGURE 6 is an expanded view of the various layers and materials used in forming the printed circuit board used in the device of FIGURE 1.

In the arrangement of FIGURE 6 the various layers of material used in the production of the device shown in FIGURES 1–5 are positioned in order and the actual assembly process will now be described. As in the other figures the base layer of epoxy glass laminate is shown at numeral 10 and adjacent it are the adhesive layer 14 and a layer of aluminum foil 28 which is positioned between said base layer and a heated platen 30 forming part of a press capable of subjecting the assembly to both pressure and heat. Adjacent the adhesive layer 14 is the outer layer of laminate which is shown as being $\frac{1}{64}$ inch thick and which has the outer printed circuit bonded thereto. As shown in FIGURES 3 and 4 both of the adhesive layer 14 and the laminate layer 16 have a number of perforations which have been made for the purpose of providing access to the solder terminals 12*a*, 12*b*, etc., on the base layer. During the curing process the epoxy resin in the adhesive layer 14 will flow to some considerable extent and if means are not provided for preventing it, this resin will flow into the depressions formed by these perforations, thereby effectively covering the solder terminals 12*a*, 12*b*, etc. It has been found that if these depressions are filled during the curing process with small pads of silicone rubber, the epoxy resin will not flow over these solder terminals, and yet the silicone rubber pads will retain their shape, will not deteriorate during the curing process, will not discolor the copper circuitry and are easily removed after the assembly has been cured. The selection of material for pads 32, 32*a*, etc., is dependent upon the materials chosen for the laminate layers and, hence, the curing temperatures for the particular bonding materials used. It has been found that if these pads 32, 32*a* are too hard, they will tear or deform the laminate layers during the curing process. A layer of aluminum foil 34 is placed against the outside surface of the outside laminate layer 16 and a layer of silicone rubber approximately $\frac{1}{8}$ inch thick is placed between the aluminum foil and the opposite heated platen member 38. This silicone rubber pad tends to equalize the forces exerted by the platens and is required principally because the platens are not always compeltely smooth or parallel. If the platens were satisfactorily smooth and parallel the silicone rubber pad 36 would presumably not be required. The laminate layers are normally positioned and their registry is accomplished by usually aligning targets on the layers or by engaging holes in the layers with positioning pins. The adhesive layer is located by aligning the perforations with the holes in the top laminate. At this point, small spots of adhesive are applied between each of the layers outside the trim area. This adhesive typically discolors during curing and must be located in an area which will be removed from the finished part. The layers, assembled as described, are compressed between the platens and subjected to heat and pressure. The optimum time, temperature and pressure to accomplish the curing of the "B" stage epoxy resin were found to be one hour at approximately 320° F. and at a pressure of 225 p.s.i. for other materials, this may very somewhat.

In some cases it has been found that printed that printed circuit laminates with copper on only one side are often supplied in a warped condition. This warpage is due to thermal stresses induced by removing the clad laminate from the press while warm. This has been controlled in the present process by cooling the laminate while maintaining the pressure until the temperature of the platens reached approximately 100° F. The purpose of the aluminum foil which was positioned immediately adjacent the outside surfaces of the laminate layers is to assure a smooth and attractive finish for the end product. It will be recognized that where the epoxy glass laminate is placed immediately adjacent the rubber pad 36 that during the curing process there will be some softening of the laminate and that this will give rise to the impressing of an irregular pattern on the surface of the laminate by the flexible pad 36. It has been found that when the smoothest side of the aluminum or other metal foil is used adjacent the base layer of the laminate a very smooth and attractive surface results.

As has been indicated before it was desired to design this printed circuit board assembly such that the ultimate in reliability and lowest cost of soldering could be achieved. It was therefore desired to make it possible to dip solder the assembly and it has been found that the thermal shock due to dip soldering has not affected the adhesive bond when produced as described above. It has also been determined that the laminated board assembled as described did not in any way limit the machining operations nor other forming techniques over those normally possible in a conventional printed circuit board.

While only a single embodiment has been shown and described herein numerous modifications will occur to those skilled in the art, for example, although the structure shown and described herein consisted of epoxy glass laminate and, correspondingly, an adhesive including a "B" stage epoxy resin, where conditions will permit their use the identical teachings can be adapted to phenolic boards and phenolic resins. And while the invention has been shown and described in connection with the circuit board having two laminations, additional layers of laminate with corresponding additional printed circuitry may be used if desired. Applicants have successfully manufactured such laminated printed circuit assemblies with as many as 8 layers of printed circuitry. And while the assemblies have been shown with the interface connections accomplished through resistor and capacitor leads etc., it will be recognized that, where this is not convenient, a short jumper wire may be used to provide necessary continuity between layers. The thickness of the lower layer or base layer of laminate will depend upon the mechanical strength requirements of the particular printed circuit board. Obviously, where a large number of laminate layers are used, they will add strength to the assembly and the base layer may not be required to be so thick.

We claim:

1. A method of forming a thermosetting multi-layer printed circuit board assembly having a first layer of epoxy glass laminate with a printed circuit and fixed solder terminals on the undersurface thereof, a second layer of a glass cloth adhesive impregnated with an epoxy resin cured to the "B" stage and having openings corresponding with said solder terminals, and a third layer of epoxy glass laminate with a printed circuit thereon and openings corresponding with said solder terminals comprising the steps of, inserting small pads of silicone rubber in said openings, said pads being of a size and shape to correspond with said openings, placing said assembled layers between heated platens for bonding said layers together, one of said platens having a silicone rubber padding adjacent thereto, withdrawing said assembly from between said layers and removing said pads from said openings, drilling holes through said layers at the location of said solder terminals, attaching the desired electrical components to the back of said assembly so that the leads extend through said holes and make contact with said solder terminals, and dip soldering said assembly to make soldered junctions at all of said solder terminals.

2. A method of forming a printed circuit board assembly, as set forth in claim 1, wherein aluminum foil is placed between the platens and said assembly.

3. A method of forming a thermosetting multi-layer printed circuit board assembly having a first layer with a printed circuit and fixed solder terminals on the undersurface thereof, a second layer with a printed circuit thereon and openings corresponding with said solder terminals, and a third layer impregnated with a material capable of being bonded to both said first and second layers, said third layer being interposed between said first and second layers and having openings corresponding with said solder terminals, comprising the steps of inserting small flexible pads in said openings, bonding said layers together, removing said pads from said openings, drilling holes through said bonded assembly at the location of said solder terminals, attaching the desired electrical components to said assembly so that the leads of said components extend through said holes and make contact with said solder terminals, and dip soldering said assembly to make soldered junctions at all of said solder terminals.

4. A method of forming a printed circuit board assembly, as set forth in claim 3, wherein said small flexible pads are formed of silicone rubber.

5. A method of forming a printed circuit board assembly, as set forth in claim 3, wherein bonding of said layers results from heat and pressure applied by two oppositely disposed platens, one of which has a flexible pad between it and said assembly.

6. A method of forming a thermosetting multi-layer printed circuit board assembly having a first base layer of epoxy laminate with a printed circuit and fixed solder terminals on one side thereof, a second layer of epoxy glass laminate with a printed circuit thereon and openings corresponding with said solder terminals, said printed circuitry of said second layer being designed to be interconnected with the printed circuitry of said first layer by connections normal to the plane of said circuitry, and a third layer of glass cloth adhesive impregnated with an epoxy resin cured to the "B" stage and having openings corresponding with said solder terminals, comprising the steps of inserting small pads of heat resistant resilient material in said openings, placing a layer of metal foil on each side of the assembled layers, placing a layer of heat resistant resilient material adjacent at least one side of the assembly, subjecting said assembled layers to heat and pressure between two parallel platens for a time and at a temperature sufficient to effect a satisfactory bond between said layers, withdrawing said bonded layered assembly from between said platens, and removing said metal foil and small pads from said assembly.

7. A method of forming a thermosetting multi-layer printed circuit board assembly having a first layer with a printed circuit and rigid solder terminals on one side thereof, a second layer with a printed circuit thereon and openings corresponding with said solder terminals, and a third layer of adhesive material having openings corresponding with said solder terminals, comprising the steps of inserting small pads of heat resistant resilient material in said openings, placing said layers in exact registry and subjecting them to heat and pressure for a time and at a temperature sufficient to bond said first and second layers with said adhesive layer, and removing said small pads from said openings.

References Cited by the Examiner

UNITED STATES PATENTS

| | | | |
|---|---|---|---|
| 1,448,376 | 3/1923 | Berger | 18—48.3 |
| 2,734,150 | 2/1956 | Beck. | |
| 2,876,393 | 3/1959 | Talley et al. | |
| 2,956,613 | 10/1960 | Edelman et al. | |
| 2,957,794 | 10/1960 | Shellerly et al. | |
| 3,023,459 | 3/1962 | Cook | 18—48.3 |

FOREIGN PATENTS

| | | |
|---|---|---|
| 133,819 | 7/1946 | Australia. |

OTHER REFERENCES

"Epoxies—No Wonder!," Modern Plastics, pp. 89 and 94 to 97 inclusive, October 1952.

ALEXANDER WYMAN, *Primary Examiner.*

CARL F. KRAFFT, *Examiner.*